United States Patent
Rodgers

(10) Patent No.: US 11,678,469 B2
(45) Date of Patent: *Jun. 13, 2023

(54) ADA COMPLIANT SHIELDED DOOR

(71) Applicant: ETS-Lindgren Inc., Cedar Park, TX (US)

(72) Inventor: Brian Adair Rodgers, Cedar Park, TX (US)

(73) Assignee: ETS-Lindgren Inc., Cedar Park, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/572,788

(22) Filed: Jan. 11, 2022

(65) Prior Publication Data

US 2022/0132710 A1 Apr. 28, 2022

Related U.S. Application Data

(63) Continuation of application No. 17/012,355, filed on Sep. 4, 2020, now Pat. No. 11,252,850.

(51) Int. Cl.
*H05K 9/00* (2006.01)
*E06B 7/22* (2006.01)

(52) U.S. Cl.
CPC ............ *H05K 9/0015* (2013.01); *E06B 7/22* (2013.01); *H05K 9/0003* (2013.01)

(58) Field of Classification Search
CPC .................................................. H05K 9/0003
See application file for complete search history.

(56) References Cited

U.S. PATENT DOCUMENTS

| | | | | |
|---|---|---|---|---|
| 3,589,070 A | * | 6/1971 | Hansen | H05K 9/0016 174/371 |
| 4,069,618 A | * | 1/1978 | Geiss | H05K 9/0016 174/351 |
| 4,177,353 A | | 12/1979 | McCormack | |
| 4,677,251 A | * | 6/1987 | Merewether | H05K 9/0016 174/368 |
| 4,724,635 A | * | 2/1988 | Side | H05K 9/0016 49/489.1 |
| 4,746,765 A | | 5/1988 | Mallott | |
| 4,760,214 A | * | 7/1988 | Bienia | H05K 9/0016 174/368 |
| 4,794,206 A | | 12/1988 | Weinstein | |
| 4,817,337 A | * | 4/1989 | Lahita | E06B 7/2314 174/384 |

(Continued)

*Primary Examiner* — Hung V Ngo

(74) *Attorney, Agent, or Firm* — Christopher & Weisberg, P.A.

(57) ABSTRACT

An ADA compliant shielded door is disclosed. According to one aspect, a door is configured to create a radio frequency (RF) seal when the door is sealed so that RF energy is restricting from passing through a gap between an outer periphery of the door and a door frame when the door is sealed. The door includes: at least one knife edge along at least part of the outer periphery of the door, each knife edge configured to project into a channel of a door frame in a direction parallel to a face of the door when the door is sealed. The door also includes at least one contact element along a length of a knife edge, the at least one contact element being configured to make electrical contact with a channel wall of a channel of the door frame when the knife edge projects into the channel.

18 Claims, 8 Drawing Sheets

(56) References Cited

U.S. PATENT DOCUMENTS

| | | | |
|---|---|---|---|
| 4,902,851 A | | 2/1990 | Richter |
| 5,013,869 A | * | 5/1991 | Breithaupt ................ E06B 5/18 |
| | | | 174/368 |
| 5,353,029 A | | 10/1994 | Johnston et al. |
| 5,569,878 A | | 10/1996 | Zielinski |
| 5,847,316 A | | 12/1998 | Takada |
| 6,289,635 B1 | | 9/2001 | Procton et al. |
| 6,519,899 B1 | | 2/2003 | Hurzeler |
| 6,914,184 B1 | * | 7/2005 | Lahita .................. H05K 9/0015 |
| | | | 174/374 |
| 8,925,251 B1 | * | 1/2015 | Rust ......................... E06B 7/18 |
| | | | 49/495.1 |
| 9,820,415 B1 | | 11/2017 | Rust |
| 11,252,850 B1 | * | 2/2022 | Rodgers ................. E06B 7/205 |
| 2007/0007037 A1 | | 1/2007 | Diaferia |
| 2010/0096180 A1 | | 4/2010 | Carducci et al. |
| 2016/0249494 A1 | * | 8/2016 | Merewether, Sr. .. H05K 9/0016 |

\* cited by examiner

ADA COMPLIANT SHIELDED DOOR

CROSS REFERNCE TO RELATED APPLICATIONS

This application is a Continuation of U.S. patent application Ser. No. 17/012,355 filed on Sep. 4, 2020, entitled "ADA COMPLIANT SHIELDED DOOR", the entirety of which is incorporated herein by reference.

TECHNICAL FIELD

This disclosure relates to a method and system for providing a radio frequency (RF) seal around a door to an electromagnetic test chamber such as an anechoic chamber.

INTRODUCTION

In some applications, a conventional door for a welded enclosure or modular system, such as for an anechoic chamber, is designed with rugged materials and reinforcements to make the door strong for heavy industrial applications. For an anechoic or reverberation chamber, for example, such doors must prevent radio frequency (RF) leakage around the gaps between the door and door frame. FIG. 1 is an example of a door 12 in a closed position. The door 12 may possibly have insulation 14 within the outer edges of a channel 16. The door 12 has a knife edge 18 that extends into a channel 20 of a receiver 22 of a fixed door frame 24 in a direction that is perpendicular to a face of the door 12. Copper fingers 26 complete an electrical path between the fixed door frame 24 and the door 12 via the copper fingers 26 being in physical contact with the knife edge 18 when the door is closed and the knife edge is inserted into the channel 20.

The gauge of galvanized steel used to make the door may be increased for improved magnetic field shielding performance. A feature of such conventional doors is that the knife edge, when inserted into the recess, is perpendicular to the plane of the door when the door is in the closed position. This is shown in FIG. 1. One disadvantage to such a configuration is the requirement of a tall door threshold below the door.

The Americans with Disabilities Act (ADA) imposes requirements on doors to ensure greater accessibility to those disabilities. For example, a door meeting such requirements may not have a door threshold greater than a half inch high with beveling required for heights of at least a quarter inch. The door must open with less than 5 lbs. of force. In addition to the ADA, requirements may include an RF sealing goal of −100 dB from 200 kHz to 10 GHz, and manual operation of the door. Because the door threshold height is limited to half an inch, the standard approach to achieving RF sealing shown in FIG. 1 is not ADA compliant.

SUMMARY

Some embodiments advantageously provide a method and system for providing a radio frequency (RF) seal around a door to an electromagnetic test chamber such as an anechoic chamber.

According to one aspect, a door sealing system configured to create a radio frequency (RF) seal so that RF energy is restricting from passing through a gap between a door and a door frame when a door is sealed. The door sealing system includes a door having an outer periphery, and a plurality of first knife edges around at least part of the outer periphery of the door, each of the first knife edges projecting outward into a channel of a door frame in a direction parallel to a face of the door as the door is sealed. The door frame surrounds the outer periphery of the door when the door is closed and has a plurality of channels around the at least part of the outer periphery of the door, each channel of the door frame having walls between which a knife edge is received by the channel. The door sealing system also includes contact elements on a side of each knife edge of the plurality of first knife edges, the contact elements on a knife edge of the first knife edges being configured to make electrical contact with a channel wall of a corresponding channel of the door frame when the knife edge of the first knife edges is moved into the corresponding channel, the electrical contact of the contact elements with the channel wall providing an RF-suppressing connection. The door sealing system also includes a motive force application system configured to move the plurality of first knife edges into their corresponding channels of the door frame when the door is closed.

According to this aspect, in some embodiments, the door frame further includes a plurality of second knife edges along at least part of the door frame, each of the second knife edges projecting inward along a channel of the door frame in a direction parallel to a face of the door as the door is sealed. In some embodiments, to seal the door, the motive force application system causes the plurality of first knife edges to project outward into channels of the door frame followed by causing the plurality of second knife edges to project inward along channels of the door frame. In some embodiments, the plurality of first knife edges are located at a top and bottom of the door and the plurality of second knife edges are located at sides of the door frame. In some embodiments, the motive force application system includes a wheel and gears configured to seal and unseal the door by turning the wheel, a ratio of the gears being selected so that a force required to open the door is less than a force threshold. In some embodiments, the motive force application system includes a lever arm and gears configured to seal and unseal the door by pulling the lever arm, a ratio of the gears being selected so that a force required to open the door is less than a force threshold. In some embodiments, the motive force application system includes a linear actuator and motor to compress a master cylinder which serves slave cylinders that apply force to move the plurality of first knife edges into their respective channels. In some embodiments, the motive force application system includes a plurality of valves, each valve configured to regulate a flow of fluid from the master cylinder to a slave cylinder in mechanical communication with a knife edge of the plurality of first knife edges, the regulating causing fluid to flow from the master cylinder to a slave cylinder via the valve, and wherein compression of the master cylinder causes the slave cylinders to apply force to move the knife edges into their respective channels. In some embodiments, the valves are actuated mechanically by a cam configuration to actuate a first set of valves followed by actuation of a second set of valves. In some embodiments, at least one valve is a three way-two position valve that is in series communication with at least one other three way-two position valve.

According to another aspect, a system for sealing a door to create a radio frequency (RF) seal between a door and a door frame includes: a first set of knife edges in the door and a first set of channels in a door frame that at least partially surrounds the door when the door is closed, the first set of channels corresponding to the first set of knife edges. The system includes a motive force application system to cause movement of the first set of knife edges. The system includes a first set of slave cylinders configured to be responsive to a compressed fluid to move the first set of knife edges of the door into the first set of channels of the door frame, each knife edge of the first set of knife edges being oriented to project into a corresponding channel of the first set of channels, the projecting being in a direction that is parallel to a face of the door. The system further includes a first set of valves configured to regulate a flow of compressed fluid to the first set of slave cylinders. A master cylinder configured to be manually activated to provide compressed fluid to the first set of valves to one of seal and unseal the door.

According to this aspect, in some embodiments, the system further includes a second set of slave cylinders configured to be responsive to a compressed fluid to move a second set of knife edges of the door frame along channels of the door frame in a direction that is parallel to a face of the door. In some embodiments, to seal the door, the motive force application system causes the plurality of first knife edges to project outward into channels of the door frame followed by causing the plurality of second knife edges to project inward along channels of the door frame. In some embodiments, the master cylinder is manually activated via a wheel and gears configured to engage the master cylinder to cause compression of fluid in the master cylinder, a ratio of the gears being selected so that a force required to unseal the door is less than a force threshold. In some embodiments, the master cylinder is manually activated via a lever arm and gears configured to engage the master cylinder to cause compression of fluid in the master cylinder, a ratio of the gears being selected so that a force required to unseal the door is less than a force threshold. In some embodiments, the master cylinder is actuated by a linear actuator. In some embodiments, at least one valve is a three way-two position valve that is in series communication with at least one other three way-two position valve.

According to yet another aspect, a door sealing system is configured to provide a radio frequency (RF) seal, the door sealing system including a door having an outer periphery and a plurality of extendable and retractable first knife edges along at least a portion of the outer periphery, the door sealing system further including a door frame having a plurality of channels corresponding to the plurality of knife first edges, each knife edge of the first knife edges projecting outward in a direction parallel to a face of the door and into the corresponding channels when the door is in a sealed position.

According to this aspect, in some embodiments, the door frame has a plurality of second knife edges that move along channels of the door frame, the second knife edges configured to be moved inward in a direction parallel to a face of the door along channels of the door frame. In some embodiments, the door sealing system further includes a motive force application system configured to move the first set of knives into the plurality of corresponding channels followed by moving the second set of knives along channels of the door frame. In some embodiments, the door sealing system further includes a motive force application system configured to move the first set of knives into the plurality of corresponding channels after moving the second set of knives along channels of the door frame.

BRIEF DESCRIPTION OF THE DRAWINGS

A more complete understanding of embodiments described herein, and the attendant advantages and features thereof, will be more readily understood by reference to the following detailed description when considered in conjunction with the accompanying drawings wherein.

DETAILED DESCRIPTION

Figure 1:
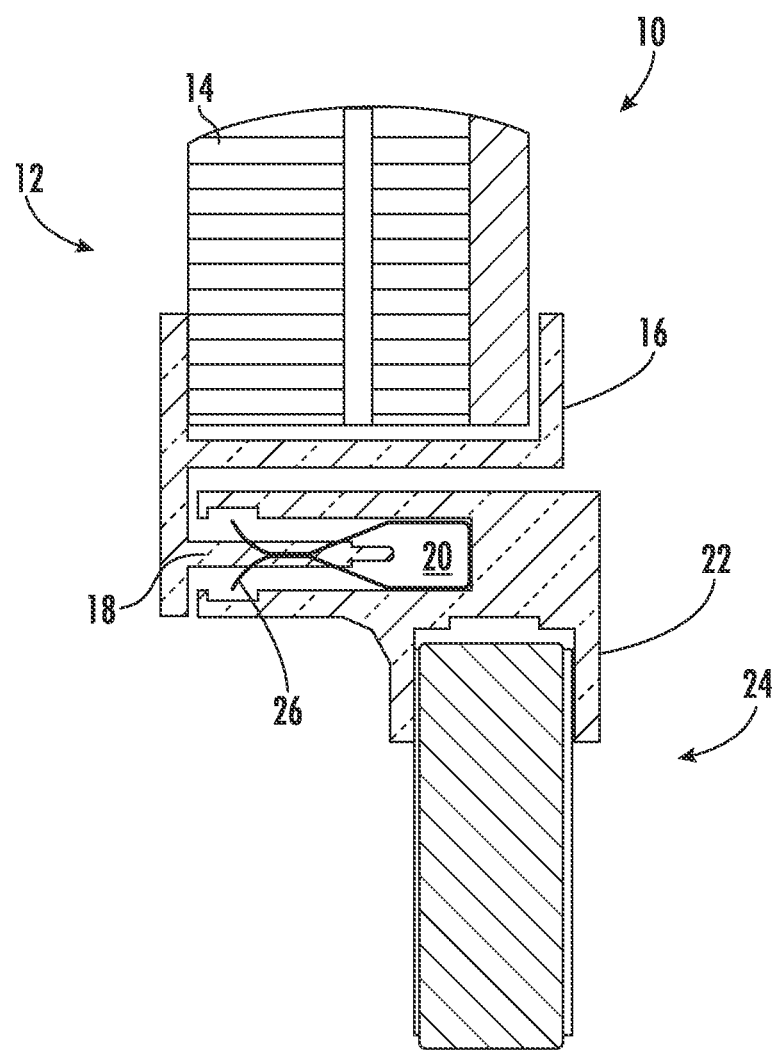
FIG. 1 shows an existing configuration for RF sealing around a door where the door has a knife edge that is perpendicular to a plane of the door so that when the door is closed, the knife edge inserts into a recess in the frame around the door, within the recess there being fingers that make contact with the knife edge.

Before describing in detail exemplary embodiments, it is noted that the embodiments reside primarily in combinations of apparatus components and processing steps related to providing an RF seal to a door. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

Some embodiments include a door sealing system for creating an RF seal to a door when the door is closed. The door sealing system provides first knife edges in the door that are received by first channels of a door frame that surrounds the door when the door is closed. Further, in some embodiments, the door sealing system provides second knife edges in the door frame that move inward along first channels of the door frame.

Figure 2:
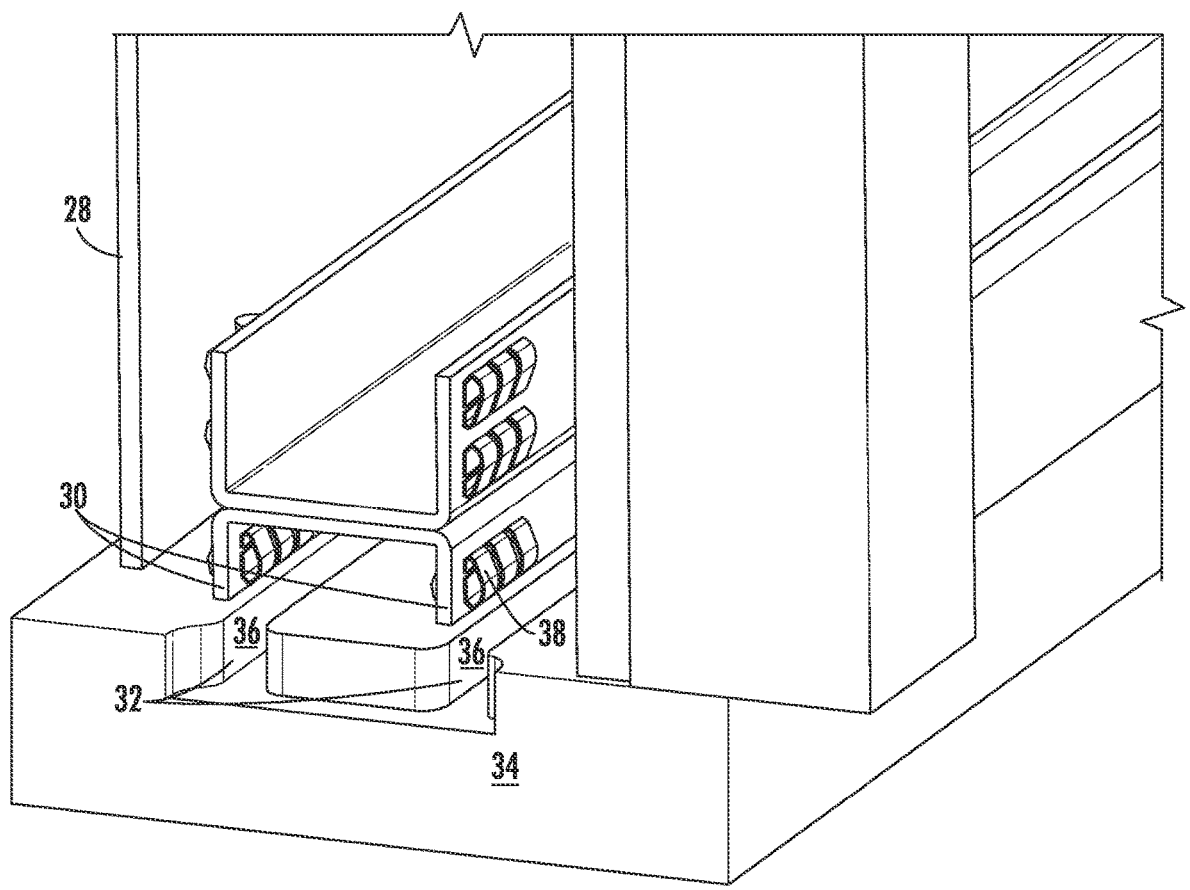
FIG. 2 shows a knife edge that is parallel to a plane of the door and configured to insert into a channel in the door frame, the channel having walls parallel to the plane of the door, such that the knife edge makes contact with the walls of the channel via conducting contact elements.

Returning to the drawings figures, FIG. 2 shows a door 28 having a double knife edge 30 that are received by channels 32 of a door frame 34. The channels 32 have walls 36 between which the double knife edge 30 is received by the channels 32. The double knife edge 30 has contact elements 38 attached to sides of the knife edges of the double knife edge 30 to form an electrical connection between the double knife edge 30 and the walls 36 of the channels 32, thereby creating an RF seal between the door 28 and the door frame 34. The contact elements 38 may be copper fingers or a conducting gasket, for example.

Figure 3:
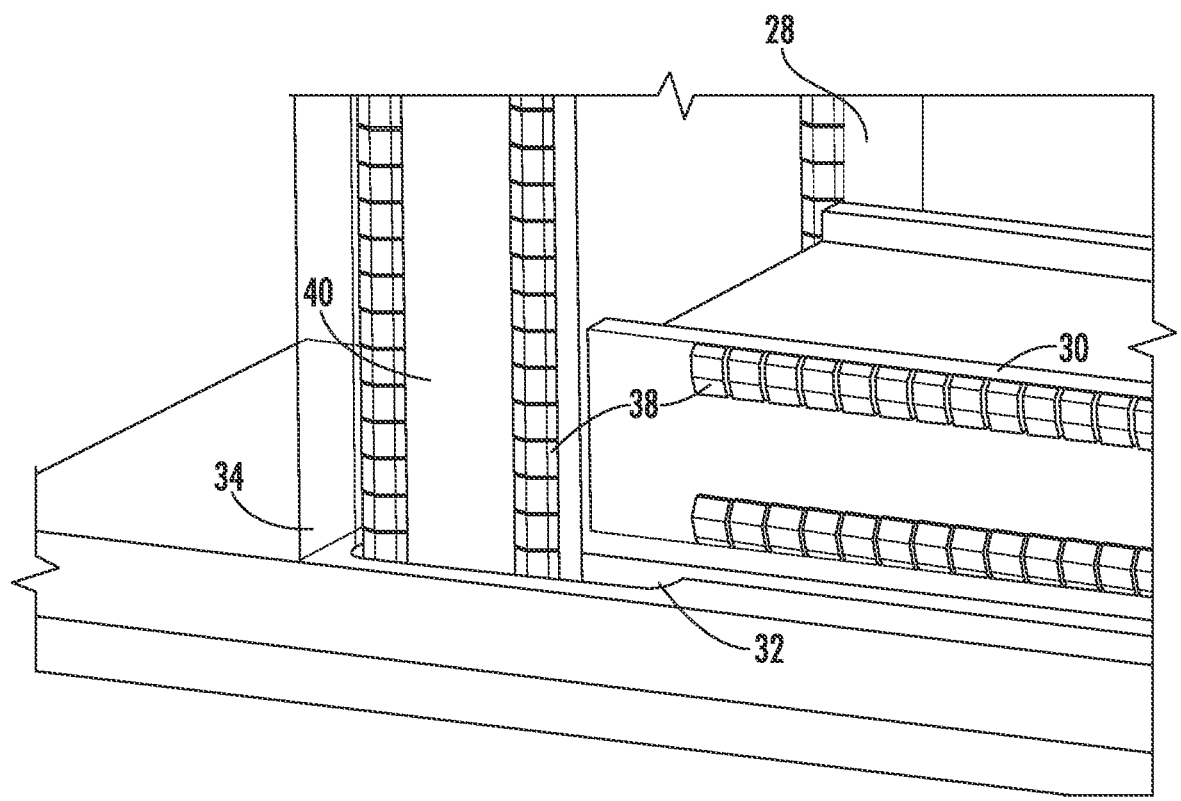
FIG. 3 illustrates a corner of a door with a horizontal knife edge and a corresponding horizontal channel and further illustrates a vertical knife edge.
Figure 4:
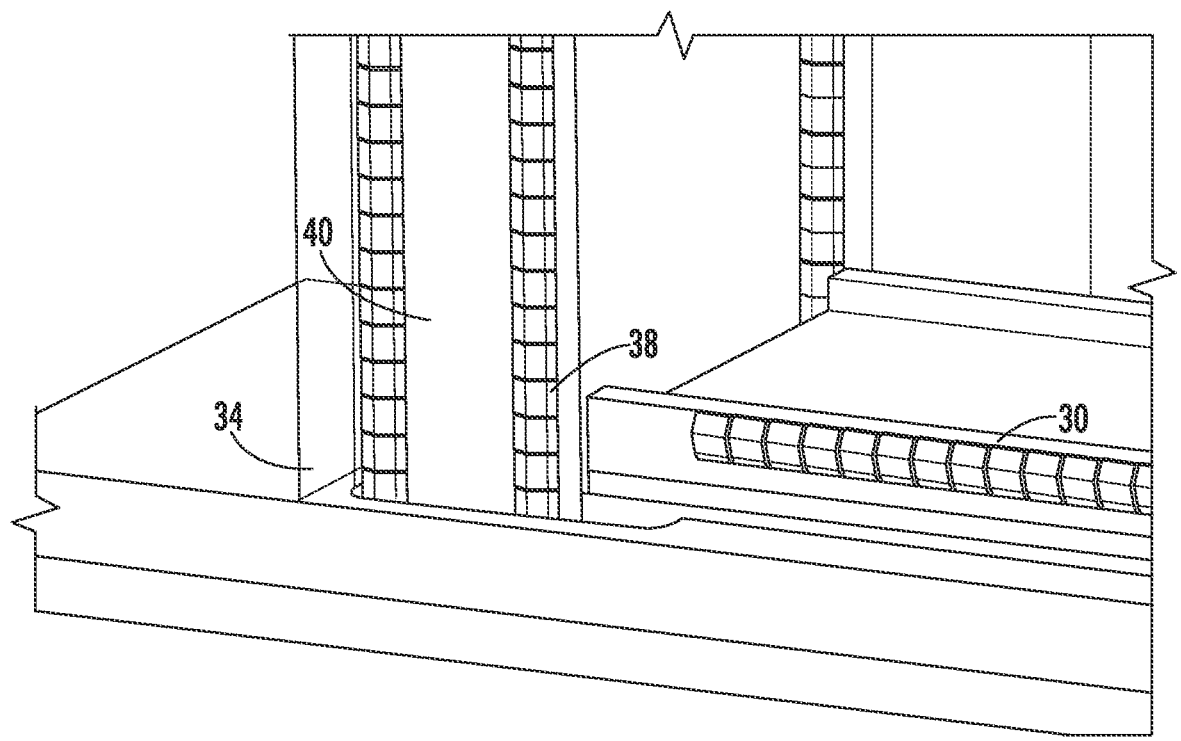
FIG. 4 illustrates the corner where the horizontal knife edge is inserted into the horizontal channel.
Figure 5:
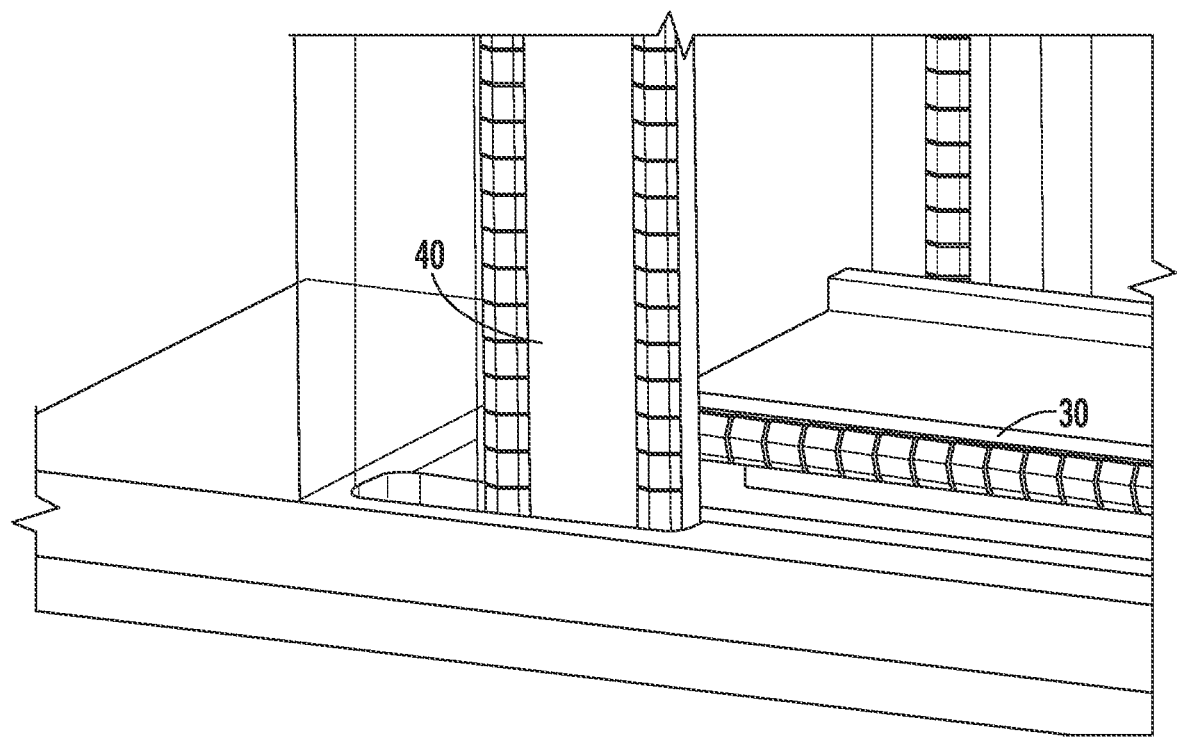
FIG. 5 illustrates the corner of the door with the vertical knife edge moved inward along the horizontal channel and overlapping the horizontal knife edge.

FIG. 3 shows a corner of the door 28 and the door frame 34 having a vertical knife edge 40 with contact elements 38. The vertical knife edge 40 moves inward along the horizontal channel 32 of the door frame 34 as the door is sealed and retracts along the horizontal channel when the door is unsealed. In some embodiments, the horizontal knife edge 30 moves downward into the horizontal channel 32 as the door is sealed and retracts upward as the door is unsealed. In some embodiments, the horizontal knife edge 30 moves into the horizontal channel 32 followed by the vertical knife edge 40 moving inward along the horizontal channel 32. This sequence is shown in FIGS. 4 and 5, where FIG. 4 shows the horizontal knife edge 30 in the sealed position and FIG. 5 shows the subsequent position of the vertical knife edge 40. In some embodiments, the vertical knife edges 40 are moved inward first followed by the horizontal knife edges 30 moving downward. Note that similar arrangements can be made in all the other corners of the door 28 and door frame 34.

A purpose of the overlapping knife edges is RF energy containment. Note that the overlapping knife edges is independent of the door closing function. That is, the door may be latched separately so that latching the door and RF-sealing the door occurs in sequence. In conventional door sealing systems, the door seals by the action of closing the door and RF sealing is thus dependent on door closing.

In some embodiments, the knife edges 30 and 40 are around an entire outer periphery of the door 28. A sequence of RF-sealing the door 28 in some embodiments is as follows:

The door 28 is closed and a 3-way/2-position valve 58 is thereby activated to permit hydraulic fluid flow;

A master cylinder 46 is compressed, causing valves 48 in communication with the master cylinder 46 to direct fluid flow to a door bolt cylinder which locks the door 28 in the closed position;

The valves 48 next direct hydraulic fluid to top (door header) and bottom (door threshold) slave cylinders 50. The slave cylinders 50 force the knife edges 30 into the header/threshold receiving channels 32;

The valves 48 then direct hydraulic fluid to the slave cylinders 52 mounted in the door frame 34. The slave cylinders 52 mounted in the door frame 34 force knife edges 40 to deploy from the door frame 34 to overlap and/or interlock with the knife edges 30 in the header/threshold receiving channels 32;

To unseal and open the door 28, the master cylinder 46 is decompressed, which causes the retraction of the knife edges 30 and 40 and the unlocking of the door 28, in an order that is the reverse of the order in which the door 28 is locked and sealed.

Figure 6:
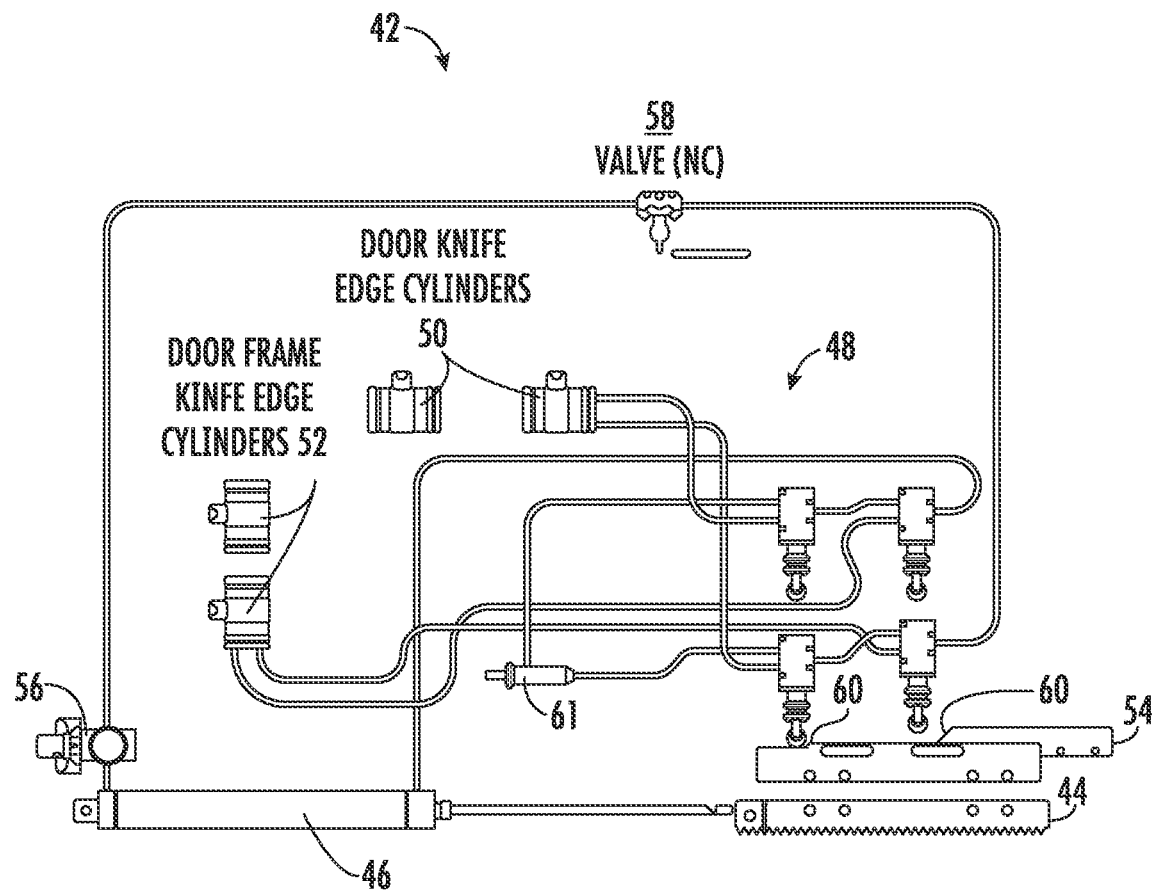
FIG. 6 illustrates a motive force application system that is configured to seal and unseal the door.

FIG. 6 illustrates an example motive force application system 42 which includes a linear actuator 44 that is configured to compress and decompress a master cylinder 46. The master cylinder 46 provide fluid to a set of four, three way-two position valves 48, numbered 1 through 4 via hydraulic fluid lines. The valves 48 are connected to door knife edge cylinders 50 that extend to cause the knife edges 30 of the door 28 to extend into corresponding channels 32 of the door frame 34. The valves 48 are also connected to the door frame knife edge cylinders 52 that extent to cause the knife edges 40 of the door frame 34 to move along channels 32 of the door frame 34 to overlap the knife edges 30 of the door 28 The sequencing of the knife edge cylinders 50 and 52 to cause sequencing of the extending of the door knife edges 30 and the door frame knife edges 40 is controlled by a mechanical switching mechanism 54 linked to the door knife edges to causes one or more valves 1 through 4 to change positions in sequence. For example, valves 1 and 4 may be switched together after valves 2 and 3 are switched. A pressure regulator 56 may be provided to regulate pressure in at least a portion of the motive force application system 42. The pressure regulator 56 may be employed to prevent overpressure of the hydraulic fluid. The valve 58 insures that the door 28 is closed before the knife edge movement is permitted to occur.

Note that although only four valves 48, two door knife edge cylinders 50 and two door frame knife edge cylinders 52 are shown in FIG. 6, a lower or greater number of valves 48 and knife edge cylinders 50 and 52 may be provided in some embodiments. Note also that either a manually powered or electromotive-driven linear actuator 44 may be employed. Further, a hydraulic pump may replace the master cylinder and linear actuator 44 to create the pressure to drive the hydraulic fluid system that includes the valves 48 and the knife edge cylinders 50 and 52. Note that the ramped edges 60 of the switching mechanism 54 can be replaced, in some embodiments, with position sensors. Note further that valves 48 may actuate a cylinder 61 which bolts the door closed before movement of the knife edges is permitted to occur, in some embodiments. Note that in some embodiments, the valves 48 may be implemented as mechanical sequencing valves, electrically activated valves and/or programmable valves. Further, in some embodiments, the hydraulic system of the motive force application system can be replaced in whole or in part by a pneumatic system with an external air compressor to supply pressure. In some embodiments, more than two parallel knife edges and corresponding parallel channels may be implemented. Instead of contact elements, a conducting gasket may be implemented.

Figure 7:
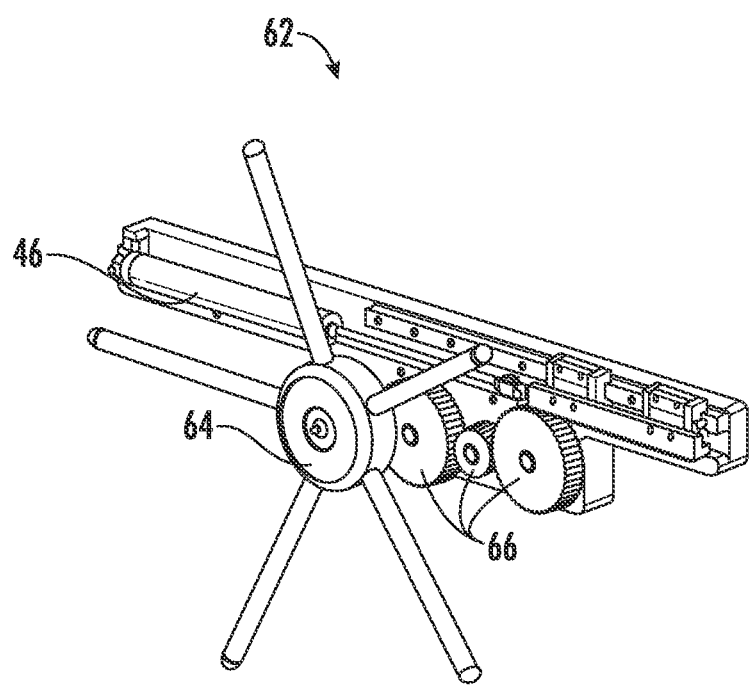
FIG. 7 shows a wheel and gears and a hydraulic piston that causes the cylinders around the periphery of the door to move the knife edge(s) into the recess of the door frame.

FIG. 7 illustrates a mechanical actuator 62 configured to compress and decompress the master cylinder 46. The actuator 62 has a wheel 64 that is coupled to gears 66 so that when the wheel is turned in one direction, the gears turn and compress the master cylinder 46 and when the wheel is turned in the opposite direction, the gears turn in the opposite direct and decompress the master cylinder 46. The ratios of the gears 66 may be chosen so that the force required to open the door is less than a force threshold.

Figure 8:
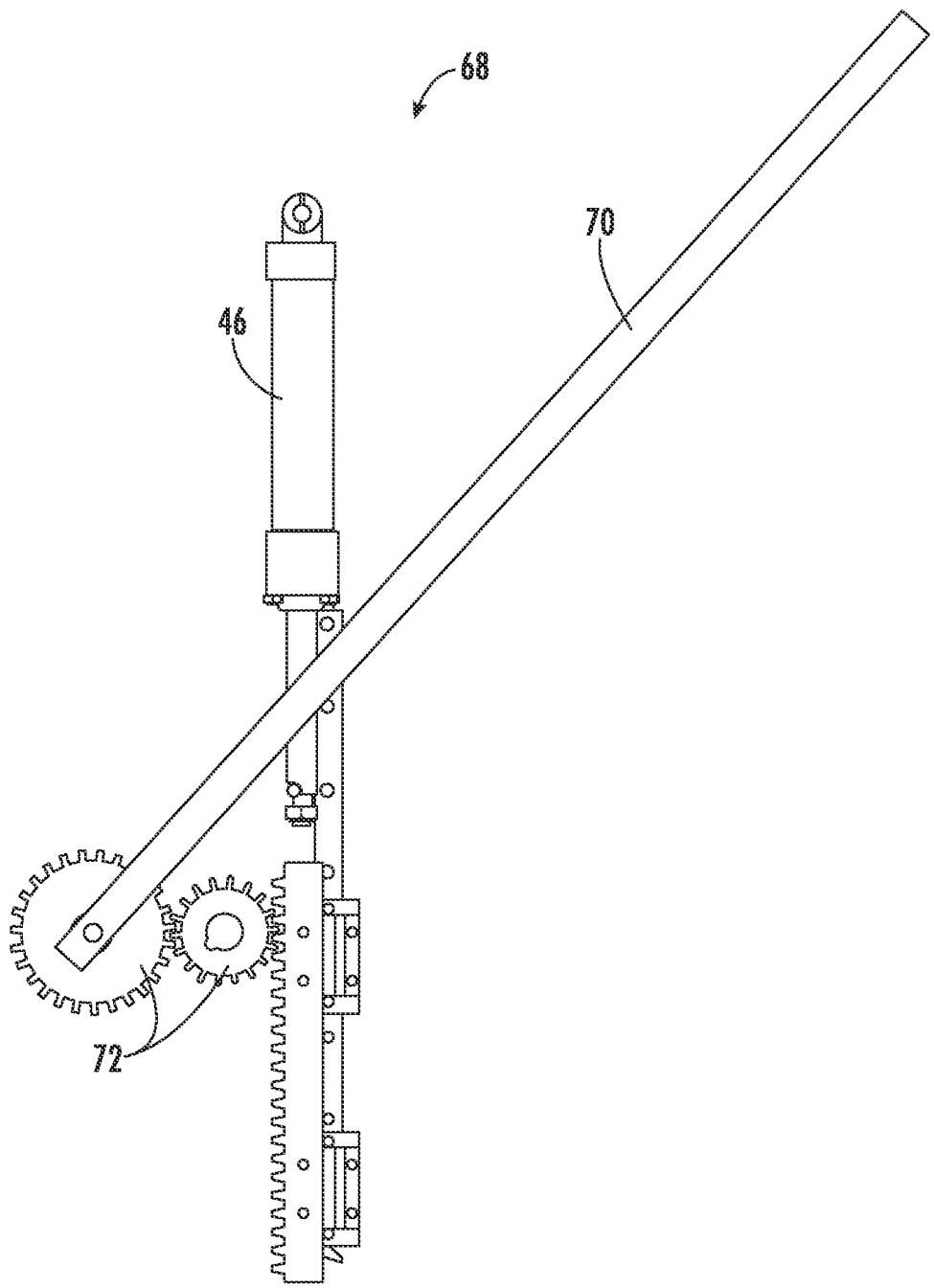
FIG. 8 shows a long handle and lever arm and gears and a hydraulic piston that causes the cylinders around the periphery of the door to move the knife edge(s) into the recess of the door frame.

FIG. 8 illustrates a mechanical actuator 68 configured to compress and decompress the master cylinder 46. The actuator 68 has a lever arm 70 that is coupled to gears 72 so that when the lever arm is pulled, the gears turn to compress or decompress the master cylinder 46. The ratios of the gears 72 may be chosen so that the force required to open the door is less than a force threshold.

According to one aspect, a door sealing system configured to create a radio frequency (RF) seal so that RF energy is restricting from passing through a gap between a door and a door frame when a door is sealed. The door sealing system includes a door having an outer periphery, and a plurality of first knife edges around at least part of the outer periphery of the door, each of the first knife edges projecting outward into a channel of a door frame in a direction parallel to a face of the door as the door is sealed. The door frame surrounds the outer periphery of the door when the door is closed and has a plurality of channels around the at least part of the outer periphery of the door, each channel of the door frame having walls between which a knife edge is received by the channel. The door sealing system also includes contact elements on a side of each knife edge of the plurality of first knife edges, the contact elements on a knife edge of the first knife edges being configured to make electrical contact with a channel wall of a corresponding channel of the door frame when the knife edge of the first knife edges is moved into the corresponding channel, the electrical contact of the contact elements with the channel wall providing an RF-suppressing connection. The door sealing system also includes a motive force application system configured to move the plurality of first knife edges into their corresponding channels of the door frame when the door is closed.

According to this aspect, in some embodiments, the door frame further includes a plurality of second knife edges along at least part of the door frame, each of the second knife edges projecting inward along a channel of the door frame in a direction parallel to a face of the door as the door is sealed. In some embodiments, to seal the door, the motive force application system causes the plurality of first knife edges to project outward into channels of the door frame followed by causing the plurality of second knife edges to project inward along channels of the door frame. In some embodiments, the plurality of first knife edges are located at a top and bottom of the door and the plurality of second knife edges are located at sides of the door frame. In some embodiments, the motive force application system includes a wheel and gears configured to seal and unseal the door by turning the wheel, a ratio of the gears being selected so that a force required to open the door is less than a force threshold. In some embodiments, the motive force application system includes a lever arm and gears configured to seal and unseal the door by pulling the lever arm, a ratio of the gears being selected so that a force required to open the door is less than a force threshold. In some embodiments, the motive force application system includes a linear actuator and motor to compress a master cylinder which serves slave cylinders that apply force to move the plurality of first knife edges into their respective channels. In some embodiments, the motive force application system includes a plurality of valves, each valve configured to regulate a flow of fluid from the master cylinder to a slave cylinder in mechanical communication with a knife edge of the plurality of first knife edges, the regulating causing fluid to flow from the master cylinder to a slave cylinder via the valve, and wherein compression of the master cylinder causes the slave cylinders to apply force to move the knife edges into their respective channels. In some embodiments, the valves are actuated mechanically by a cam configuration to actuate a first set of valves followed by actuation of a second set of valves. In some embodiments, at least one valve is a three way-two position valve that is in series communication with at least one other three way-two position valve.

According to another aspect, a system for sealing a door to create a radio frequency (RF) seal between a door and a door frame includes: a first set of knife edges in the door and a first set of channels in a door frame that at least partially surrounds the door when the door is closed, the first set of channels corresponding to the first set of knife edges. The system includes a motive force application system to cause movement of the first set of knife edges. The system includes a first set of slave cylinders configured to be responsive to a compressed fluid to move the first set of knife edges of the door into the first set of channels of the door frame, each knife edge of the first set of knife edges being oriented to project into a corresponding channel of the first set of channels, the projecting being in a direction that is parallel to a face of the door. The system further includes a first set of valves configured to regulate a flow of compressed fluid to the first set of slave cylinders. A master cylinder configured to be manually activated to provide compressed fluid to the first set of valves to one of seal and unseal the door.

According to this aspect, in some embodiments, the system further includes a second set of slave cylinders configured to be responsive to a compressed fluid to move a second set of knife edges of the door frame along channels of the door frame in a direction that is parallel to a face of the door. In some embodiments, to seal the door, the motive force application system causes the plurality of first knife edges to project outward into channels of the door frame followed by causing the plurality of second knife edges to project inward along channels of the door frame. In some embodiments, the master cylinder is manually activated via a wheel and gears configured to engage the master cylinder to cause compression of fluid in the master cylinder, a ratio of the gears being selected so that a force required to unseal the door is less than a force threshold. In some embodiments, the master cylinder is manually activated via a lever arm and gears configured to engage the master cylinder to cause compression of fluid in the master cylinder, a ratio of the gears being selected so that a force required to unseal the door is less than a force threshold. In some embodiments, the master cylinder is actuated by a linear actuator. In some embodiments, at least one valve is a three way-two position valve that is in series communication with at least one other three way-two position valve.

According to yet another aspect, a door sealing system is configured to provide a radio frequency (RF) seal, the door sealing system including a door having an outer periphery and a plurality of extendable and retractable first knife edges along at least a portion of the outer periphery, the door sealing system further including a door frame having a plurality of channels corresponding to the plurality of knife first edges, each knife edge of the first knife edges projecting outward in a direction parallel to a face of the door and into the corresponding channels when the door is in a sealed position.

According to this aspect, in some embodiments, the door frame has a plurality of second knife edges that move along channels of the door frame, the second knife edges configured to be moved inward in a direction parallel to a face of the door along channels of the door frame. In some embodiments, the door sealing system further includes a motive force application system configured to move the first set of knives into the plurality of corresponding channels followed by moving the second set of knives along channels of the door frame. In some embodiments, the door sealing system further includes a motive force application system configured to move the first set of knives into the plurality of corresponding channels after moving the second set of knives along channels of the door frame.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A door configured to create a radio frequency (RF) seal when the door is sealed so that RF energy is restricting from passing through a gap between an outer periphery of the door and a door frame when the door is sealed, the door comprising:
   at least one knife edge along at least part of the outer periphery of the door, each knife edge configured to project into a channel of a door frame in a direction parallel to a face of the door when the door is sealed;
   at least one contact element along a length of a knife edge, the at least one contact element being configured to make electrical contact with a channel wall of a channel of the door frame when the knife edge projects into the channel; and
   mechanical linkage to cause at least one knife edge to project into the channel upon application of a sealing motive force and to retract from the channel with the application of an unsealing motive force.

2. The door of claim 1, wherein the mechanical linkage is linked to a hydraulic system.

3. The door of claim 1, wherein the sealing motive force is less than a predetermined sealing force threshold.

4. The door of claim 3, wherein the predetermined sealing force threshold is 5 pounds.

5. The door of claim 1, wherein the unsealing motive force is less than a predetermined unsealing force threshold.

6. The door of claim 5, wherein the predetermined unsealing force threshold is 5 pounds.

7. The door of claim 1, wherein the mechanical linkage is configured to cause at least one of the at least one knife edge to project into the channel by a depth of less than one inch.

8. The door of claim 1, wherein the mechanical linkage is further configured to latch the door in a closed position after projecting a knife edge into a channel of the door frame.

9. The door of claim 1, wherein the mechanical linkage is further configured to latch the door in a close position before projecting a knife edge into a channel of the door frame.

10. The door of claim 1, wherein at least one knife edge is at a bottom of the door and is configured to project downward into a channel of the door frame having a depth of less than one half inch.

11. The door of claim 1, wherein the door further includes a plurality of knife edges around the outer periphery of the door, each knife edge having at least one contact element along a length of the knife edge, the plurality of knife edges configured to project into one or more channels of the door frame to obtain RF suppression of better than −90 dB in a frequency range between 200 kilo-Hertz and 10 giga-Hertz.

12. The door of claim 1, wherein the door further includes a first set of at least one knife edge configured to project into a first channel and a second set of at least one knife edge configured to project into a second channel after the first set of at least one knife edge projects into the first channel.

13. The door of claim 12, wherein the first channel and the second channel are perpendicular.

14. The door of claim 12, wherein a first knife edge of the first set is horizontal and moves vertically and a second knife edge of the second set is vertical and moves horizontally.

15. The door of claim 12, wherein a first knife edge of the first set is vertical and moves horizontally and a second knife edge of the second set is horizontal and moves vertically.

16. The door of claim 1, wherein at least one contact element of the at least one contact element includes copper fingers.

17. The door of claim 1, wherein at least one contact element of the at least one contact element includes a conducting gasket.

18. The door of claim 1, wherein a channel of the door frame includes two parallel subchannels and a knife edge configured to project into the channel has two parallel knife edge walls distanced so that each of the two parallel knife edge walls of the knife edge project into the subchannels simultaneously.

* * * * *